United States Patent [19]

Brown

[11] Patent Number: 4,918,511
[45] Date of Patent: Apr. 17, 1990

[54] THERMAL EXPANSION COMPENSATED METAL LEAD FRAME FOR INTEGRATED CIRCUIT PACKAGE

[75] Inventor: Candice H. Brown, San Jose, Calif.

[73] Assignee: Advanced Micro Devices, Inc., Sunnyvale, Calif.

[21] Appl. No.: 697,318

[22] Filed: Feb. 1, 1985

[51] Int. Cl.⁴ .............................................. H01L 23/48
[52] U.S. Cl. .......................................... 357/70; 357/81
[58] Field of Search ................................... 357/20, 81

[56] References Cited

U.S. PATENT DOCUMENTS

| | | | |
|---|---|---|---|
| 4,410,905 | 10/1983 | Grabbe | 357/70 |
| 4,417,266 | 11/1983 | Grabbe | 357/70 |
| 4,482,915 | 11/1984 | Nishikawa et al. | 357/70 |
| 4,523,218 | 6/1985 | Kato | 357/70 |

Primary Examiner—Edward J. Wojciechowicz
Attorney, Agent, or Firm—John P. Taylor

[57] ABSTRACT

A metal lead frame for an integrated circuit package is disclosed having stress relieving means formed therein to inhibit breakage of a thermally mismatched silicon die subsequently attached thereto and then heated during normal operation of the device. The stress relieving means may comprise parallel grooves formed in one or both surfaces of the central portion of the lead frame where a silicon integrated circuit die will subsequently be bonded to the lead frame. Preferably, the grooves are formed in both axes comprising the plane of the lead frame and may be formed on both surfaces of the lead frame. The stress relieving means may also comprise a series of openings cut through the central portion of the lead frame.

1 Claim, 3 Drawing Sheets

THERMAL EXPANSION COMPENSATED METAL LEAD FRAME FOR INTEGRATED CIRCUIT PACKAGE

BACKGROUND OF THE INVENTION

1. Field of the Invention

This invention relates to integrated circuit packaging. More particularly, this invention relates to an integrated circuit package having a lead frame compensated for thermal mismatch between the lead frame and the integrated circuit die.

2. Background Art

Conventionally, an integrated circuit chip is packaged by bonding the silicon chip to the center, die paddle portion, of a lead frame constructed of a nickel-steel alloy such as Alloy 42 which is selected for good electrical conductivity as well as thermal expansion characteristics matching that of silicon. However, with continued shrinkage of size of integrated circuit structures and consequent dense packing of the devices constituting the integrated circuit structure the efficient removal of heat generated by the integrated circuit structure has become more important. This, in turn, has lead to the use of copper lead frames due to the excellent heat and electrical conductivity properties of copper.

However, despite the improved heat dissipation characteristics of an integrated circuit package constructed using a copper lead frame, the difference between the thermal expansion coefficients of copper and silicon has necessitated the use of thicker and, sometimes, more flexible bonding agents, such as silver-filled epoxy resins, to bond the silicon die to the copper lead frame to prevent cracking of the silicon die as heat is generated by the package during normal operation. The thickness, however, of such a bonding agent is not easily controlled. Furthermore, the use of a thick and flexible bonding agent can result in tilting of the die, i.e., non-parallel spacing between the die and the lead frame, making lead attachment more difficult, particularly with automated equipment.

It would, therefore, be desirable to provide for thermal compensation between a silicon integrated circuit die and a lead frame having a different thermal coefficient of expansion by relieving the stress inside the lead frame rather than through the die attachment means.

SUMMARY OF THE INVENTION

It is therefore an object of the invention to provide an improved integrated circuit package comprising a silicon integrated circuit die attached to a thermal expansion compensated metal lead frame.

It is another object of the invention to provide an improved integrated circuit package comprising a silicon integrated circuit die attached to a metal lead frame having mechanical stress relieving means incorporated therein to provide thermal expansion compensation for a metal lead frame coefficient of thermal expansion differing from the thermal coefficient of expansion of silicon.

It is yet another object of the invention to provide an improved integrated circuit package comprising a silicon integrated circuit die attached to a metal lead frame having mechanical stress relieving means comprising openings or grooves cut into the metal lead frame to provide thermal expansion compensation for a metal lead frame coefficient of thermal expansion differing from the thermal coefficient of expansion of silicon.

These and other objects of the invention will be apparent from the following description and accompanying drawings.

In accordance with the invention, an improved integrated circuit package is provided comprising an integrated circuit die bonded to a metal lead frame having portions of the lead frame beneath the die removed to provide stress relief for the balance of the lead frame in contact with the die.

DESCRIPTION OF THE PREFERRED EMBODIMENT

Figure 1:
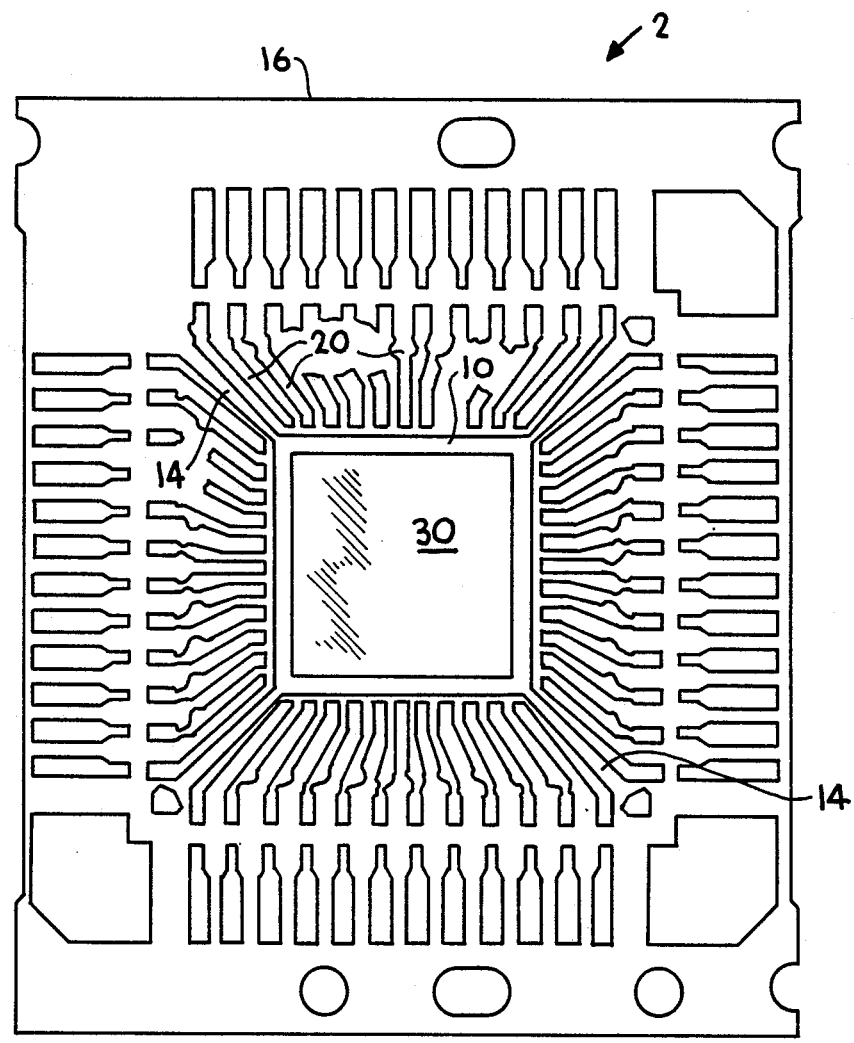
FIG. 1 is a top view of an integrated circuit die attached to a lead frame.

Referring now to FIG. 1, a lead frame is generally indicated at 2 comprising a central die paddle 10 having an integrated circuit die 30 bonded thereto. At the illustrated stage of construction of the integrated circuit package, frame 2 is provided with a plurality of lead fingers 20 which are attached to a peripheral support frame 16 and depend inwardly toward central die paddle 10. Central die paddle 10 is also connected to peripheral frame 16 by support fingers 14 which extend diagonally from the four corners of central die paddle 10 to peripheral frame 16. It will be understood, of course, that after attachment of integrated circuit die 30 to die paddle 10 and attachment of leads from die 30 to lead fingers 20, the assembly will be encapsulated in a plastic packaging material (or ceramic package) and the peripheral support frame 16 will be severed from lead frame 2 leaving each lead finger 20 independently connected to integrated circuit die 30.

Figure 2:
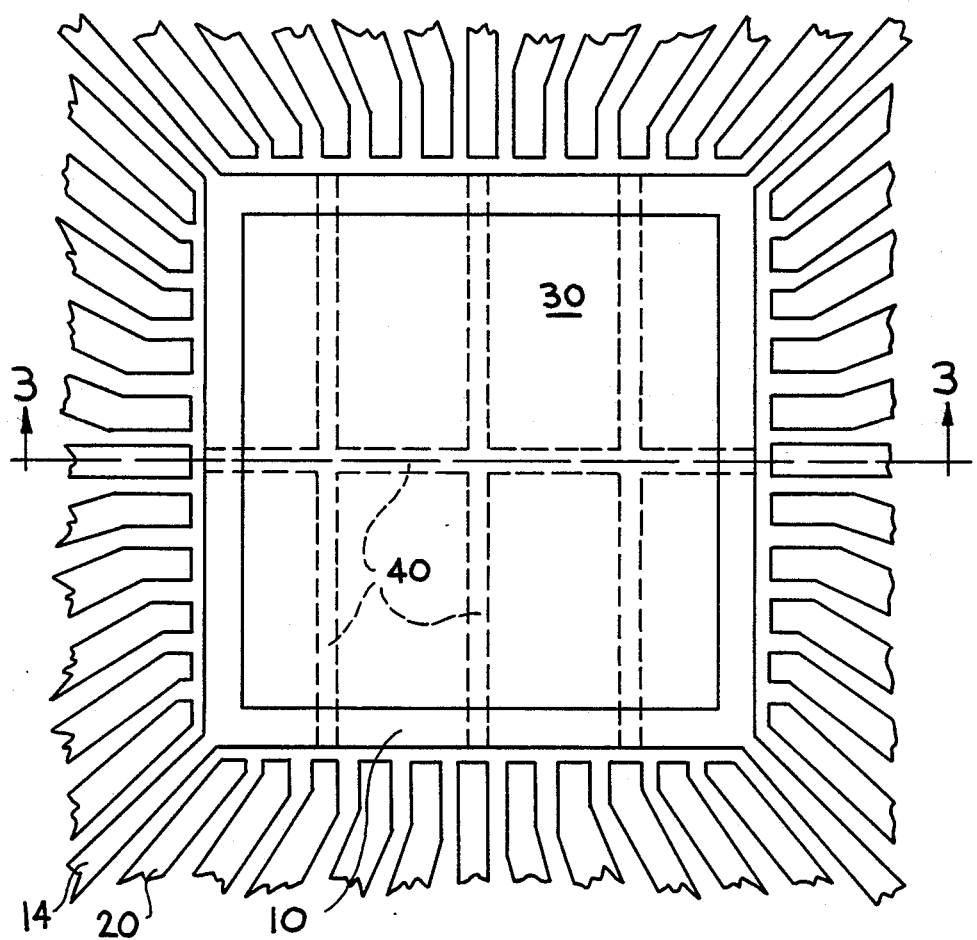
FIG. 2 is a top view of the central portion of FIG. 1 showing the stress-relieving means in the lead frame.
Figure 3:
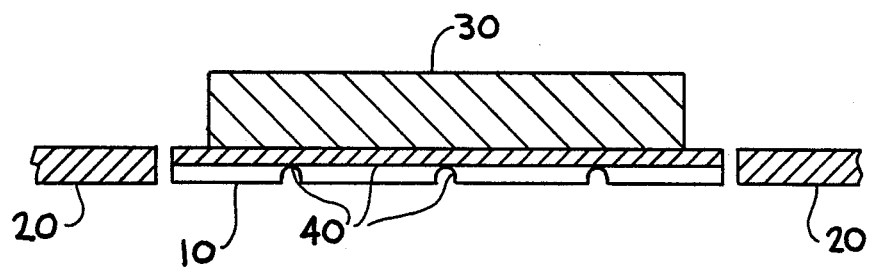
FIG. 3 is a side section view of the embodiment shown in FIG. 2.

In accordance with the invention, central die paddle 10 is provided with stress relieving means which, in the embodiment illustrated in FIGS. 2 and 3, comprise expansion joints or grooves 40 which have been etched or scored into at least one surface of die paddle 10. As best seen in FIG. 2, grooves 40 are positioned in both axes in the plane of the die paddle to provide for compensation of the expansion of die paddle 10 along either axis.

Grooves 40 may be placed in either the top or bottom surfaces of die paddle 10. The grooves should be formed as deep as is possible without interfering with the mechanical integrity of the lead frame, i.e., the lead frame must not be mechanically weakened to a degree that it becomes too fragile for normal handling during fabrication of the integrated circuit package. Preferably, groove 40 is cut to a depth of about 40 to 70% of the thickness of lead frame 2, e.g., about a 5 mil depth for a 10 mil thick lead frame.

Figure 4:
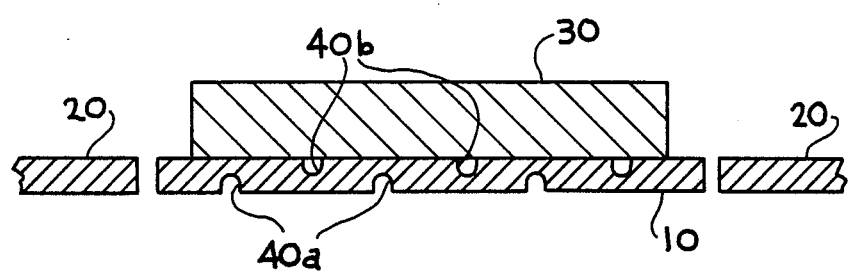
FIG. 4 is a side section view of another embodiment of the invention.

Alternatively, as shown in FIG. 4, grooves 40a and 40b may be respectively placed in both surfaces either juxtapositioned above one another or, preferably, alternately spaced in one surface and then the other. When this embodiment is utilized, the grooves must either have a depth of less than half the thickness of die paddle 10 or provision must be made to contain the bonding material used to bond die 30 to paddle 10 (as will be described below) at the intersection of the grooves along the two axes since intersecting grooves from opposite sides of die paddle 10 will create openings through die paddle 10 at these points.

With the provisions of the described stress relieving means in the metal lead frame, the metal die frame underneath the silicon die subsequently bonded thereto is mechanically weakened by reducing the normal rigidity of the die frame parallel to the plane of the silicon die. By reducing this rigidity of the metal lead frame bonded to the silicon die, the die will not tend to crack or break when it is heated during operation of the device. Rather, the weakened metal lead frame will yield.

Figure 5:
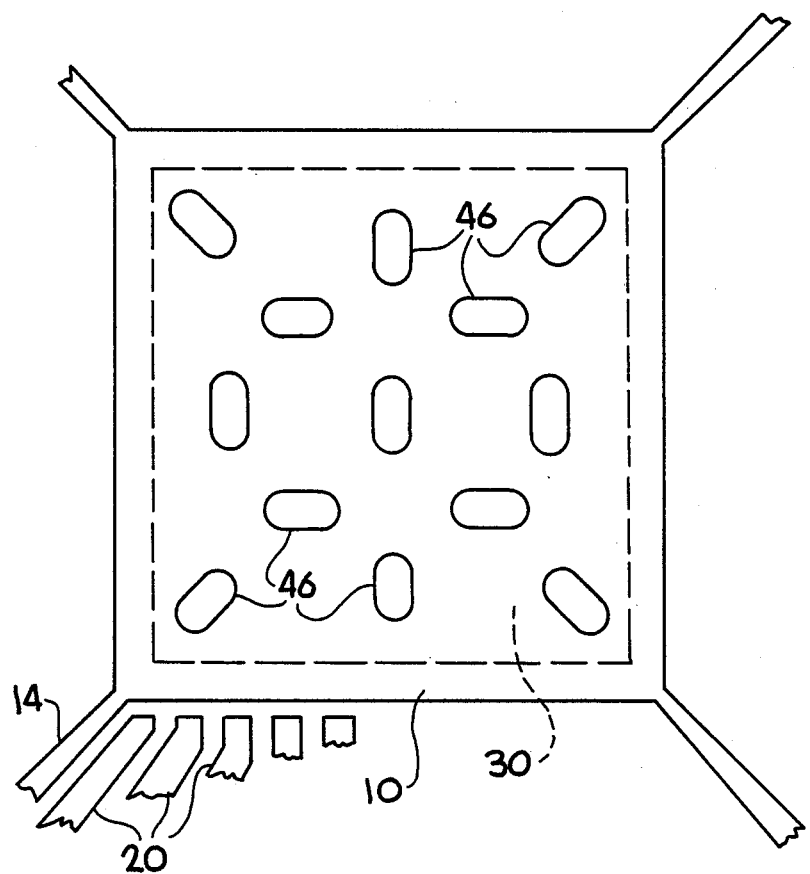
FIG. 5 is a top view of yet another embodiment of the invention.

Yet another embodiment of the invention is shown in FIG. 5 comprising a pattern of discontinuous openings 46 cut completely through die paddle 10. Openings 46 may be placed in any one of a number of patterns, depending upon the desired amount of stress relief needed.

When either this embodiment is utilized or the embodiment using deep grooves on both surfaces of die paddle 10, it is necessary to provide means for retaining the bonding agent during subsequent attachment of die 30 to die paddle 10 because these stress relieving means will be provided in the die paddle portion of lead frame 2 prior to attachment of die 30.

The bonding agent may be easily retained on the surface of die paddle 10 to which die 30 is to be attached by applying tape to the opposite surface of die paddle 10 over the openings cut therethrough. The tape may be removed after the bonding agent has set up. Alternatively, the tape may comprise an adhesive backed foil which may be left on the die paddle to serve as a supplemental heat sink and dissipation means for the heat generated by the device during normal operation.

Thus, the invention provides for a lead frame which is stress relieved in the area in contact with the silicon die so that thermal expansion of the silicon die at a different rate than the underlying die paddle metal such as copper will not result in breakage of the die. Rather, by mechanically weakening metal die paddle 10, die 30 will rigidly maintain its shape while die paddle 10 will give or buckle to take up the stress. Lead frame 2 may then be constructed of a metal chosen for its electrical conductivity and heat dissipation without fear of breakage of the silicon die due to thermal mismatch between the silicon and the type of metal used for the lead frame.

Having thus described the invention, what is claimed is:

1. A metal lead frame for an integrated circuit package comprising a central metal die support portion having thermal stress relieving means formed in at least one surface thereof comprising parallel grooves having a depth of from about 40 to 70% of the thickness of said lead frame to inhibit breakage of a silicon die susequently attached thereto when the package is heated during normal operation and the silicon has a different coefficient of expansion than the central metal die support portion of the lead frame to which it is bonded.

* * * * *